United States Patent
Kim et al.

(10) Patent No.: US 8,143,952 B2
(45) Date of Patent: Mar. 27, 2012

(54) THREE DIMENSIONAL INDUCTOR AND TRANSFORMER

(75) Inventors: Jonghae Kim, San Diego, CA (US); Shiqun Gu, San Diego, CA (US); Brian Matthew Henderson, Escondido, CA (US); Thomas R. Toms, San Diego, CA (US); Lew G. Chua-Eoan, Carlsbad, CA (US); Seyfollah S. Bazarjani, San Diego, CA (US); Matthew Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/576,033

(22) Filed: Oct. 8, 2009

(65) Prior Publication Data

US 2011/0084765 A1 Apr. 14, 2011

(51) Int. Cl.
*H03F 3/14* (2006.01)
(52) U.S. Cl. ........ 330/307; 257/531; 257/528; 257/516; 336/200
(58) Field of Classification Search .................. 257/531, 257/528, 516; 336/200; 330/307
See application file for complete search history.

(56) References Cited

U.S. PATENT DOCUMENTS

| | | | |
|---|---|---|---|
| 3,881,244 A | 5/1975 | Kendall | |
| 4,729,510 A | 3/1988 | Landis | |
| 5,446,311 A * | 8/1995 | Ewen et al. | 257/531 |
| 6,008,102 A | 12/1999 | Alford | |
| 6,031,445 A | 2/2000 | Marty | |
| 6,037,649 A * | 3/2000 | Liou | 257/531 |
| 6,114,937 A | 9/2000 | Burghartz | |
| 6,759,727 B2 * | 7/2004 | Ju | 257/531 |
| 6,869,870 B2 * | 3/2005 | Lin | 438/622 |
| 2008/0315356 A1 | 12/2008 | Reisner | |
| 2010/0052817 A1 * | 3/2010 | Fan et al. | 333/175 |

FOREIGN PATENT DOCUMENTS

| | | |
|---|---|---|
| JP | 7272932 | 10/1995 |
| WO | 2010062946 | 6/2010 |

OTHER PUBLICATIONS

International Search Report-PCT/ US2010/051868, International Search Authority-European Patent Office Dec. 15, 2010.
Written Opinion-PCT/ US2010/051868, International Search Authority-European Patent Office Dec. 15, 2010.

* cited by examiner

*Primary Examiner* — Patricia Nguyen
(74) *Attorney, Agent, or Firm* — Michelle Gallardo; Nicholas J. Pauley; Jonathan T. Velasco

(57) ABSTRACT

A three dimensional on-chip inductor, transformer and radio frequency amplifier are disclosed. The radio frequency amplifier includes a pair of transformers and a transistor. The transformers include at least two inductively coupled inductors. The inductors include a plurality of segments of a first metal layer, a plurality of segments of a second metal layer, a first inductor input, a second inductor input, and a plurality of through silicon vias coupling the plurality of segments of the first metal layer and the plurality of segments of the second metal layer to form a continuous, non-intersecting path between the first inductor input and the second inductor input. The inductors can have a symmetric or asymmetric geometry. The first metal layer can be a metal layer in the back-end-of-line section of the chip. The second metal layer can be located in the redistributed design layer of the chip.

23 Claims, 12 Drawing Sheets

THREE DIMENSIONAL INDUCTOR AND TRANSFORMER

FIELD OF DISCLOSURE

The present disclosure relates generally to integrated circuit devices, and more particularly, to inductors and transformers implemented in an integrated circuit device using through vias.

BACKGROUND

Inductors and transformers are used in a wide variety of integrated circuit applications including radio frequency (RF) integrated circuit applications. An on-chip inductor is a passive electrical component that can store energy in a magnetic field created by the current passing through it. An inductor can be a conductor shaped as a coil which includes one or more "turns." The turns concentrate the magnetic field flux induced by current flowing through each turn of the conductor in an "inductive" area within the inductor turns. The number of turns and the size of the turns affect the inductance.

Two (or more) inductors which have coupled magnetic flux form a transformer. A transformer is a device that transfers electrical energy from one circuit to another through inductively coupled conductors, usually the coils or turns of the inductors that form the transformer. A varying current in a first or "primary" inductor induces a varying voltage in a second or "secondary" inductor. If a load is coupled to the secondary inductor, a current will flow in the secondary inductor and electrical energy will flow from the primary circuit through the transformer to the load.

Conventional inductors implemented in integrated circuit dies and circuit packages can have several drawbacks. These inductors can be made by forming helical or spiral traces in conductive layers to form inductor turns. In some cases, these traces may be coupled to traces in adjacent layers in order to achieve higher inductance. Unfortunately, the inductors can consume excessive metal layer resources and may not provide sufficient current capacity or high enough quality factor without undesirable scaling. In addition, because the inductive areas of the inductors are substantially parallel with respect to other trace layers in the package substrate and circuit die, they can have unfavorable electromagnetic interference (EMI) effects on other components within the integrated circuit and/or their inductor characteristics can be adversely affected by adjacent conductors within the substrate or circuit die.

FIG. 1 shows a cross-section of CMOS technology 100 which includes three sections: a Redistributed Design Layer (RDL) section 102, a Front-End-Of-the-Line (FEOL) section 104, and a Back-End-Of-the-Line (BEOL) section 106. The FEOL section 104 includes a substrate 108 and the BEOL section 106 includes a plurality of metal layers M1-Mn. The height or thickness 114 of the FEOL section 104 is usually much greater than the height or thickness 110 of the BEOL section 106. The metal layers of the BEOL section 106 that are close to the substrate 108 are used for interconnections between devices, and conventional inductors can induce undesired coupling to surrounding layers. Thus, to provide space for interconnections and to minimize undesired coupling caused by conventional inductors, an inductor available height 112 in the BEOL section 106 away from the substrate 108 is less than the total height 110 of the BEOL section 106. Conventionally, on-chip inductors are usually fabricated using a two-dimensional geometry in one or more of the metal layers M1-Mn in the BEOL section 106.

A top-view of an exemplary symmetrical one-turn inductor 200 having two input ports 202, 204 is illustrated in FIG. 2. The symmetrical inductor 200 can be split by a symmetry line 206 such that a first half of the inductor 208 on one side of the symmetry line 206 has the same dimensions as a second half of the inductor 210 on the other side of the symmetry line 206. However, since the inductance value is proportional to the total length of the metal line used to form the inductor, the one-turn inductor geometry of the symmetrical inductor 200 has an inductance disadvantage because it only has a single turn. Additional turns or metal length can increase the inductance value.

The dimension ratio between a conventional on-chip inductor and a transistor can provide an appreciation of the relatively excessive metal layer resources that can be consumed by an inductor in a BEOL metal layer. A conventional on-chip inductor can take up a 300 µm×300 µm or an area of 90,000 µm$^2$. In contrast, using an available feature size, a transistor can take up an area of 0.09 µm$^2$. Thus, the chip size ratio between the space consumed by the inductor and the transistor is 1,000,000:1. In addition, due to CMOS technology scaling, the chip cost per mm$^2$ continues to increase because the BEOL for passive devices does not scale while the FEOL for active devices does scale. Thus, the chip cost of an inductor or transformer is very high and is likely to increase in more advanced technology nodes, for example 45 nm or 32 nm.

A top-view of an exemplary spiral multi-turn inductor 300 is illustrated in FIG. 3. The spiral architecture can be used to increase the inductance value. The spiral multi-turn inductor 300 does not have symmetry like the one-turn inductor 200 but it has an increased inductance value due to the increased total series metal length. The lack of symmetry gives the inputs of the inductor 300 polarity. Since the inductance value of the inductor 300 is proportional to the total series metal length used to form the inductor 300, the inductance value is affected by the width of the metal conductor forming the inductor turns, the space between the turns, the diameter of the metal conductor and the number of turns in the spiral. The inputs to the inductor 300 are usually brought out to the same side of the inductor structure. The spiral multi-turn inductor 300 includes a multi-turn spiral portion 302, a first input 304 and a second input 306 which is brought out from the spiral ending point 308 to the same side of the inductor 300 as the first input 304. A lead 310 is used to bring the second input 306 out from the spiral ending point 308 of the inductor 300. In this configuration, the multi-turn inductor 300 has some disadvantages versus the one-turn inductor 200. The multi-turn inductor 300 needs two metal layers: one metal layer for the first input 304 and the spiral portion 302 to increase inductance; and a second metal layer for the lead 310 to bring the second input 306 out from the spiral ending point 308. In contrast, the one-turn inductor 200 can be implemented on one metal layer. The spiral multi-turn inductor 300 also has overlap regions 312 and 314 due to its multi-turn portion 302 crossing the lead 310 which can cause capacitive coupling between the layers. These capacitive coupling of these overlap regions 312, 314 can degrade the performance of the inductor 300.

Since the metal layers M1-Mn are also used for interconnections between devices and other purposes than making inductors, such as inductors 200 and 300, the inductor available height 112 is less than the total height 110 of the BEOL section 106. These types of inductors will also induce undesired coupling to surrounding layers. To lower coupling to the substrate these types of inductors are usually put in the upper metal layers. In addition, other devices or interconnections on the same metal layer as the inductors 200 or 300 are separated from the inductor by an isolation distance, for example 100 microns, to prevent magnetic coupling between the inductor and the other devices or interconnections. This isolation distance is determined by the required isolation of circuits from the inductors magnetic field, and adds to the area consumed by the inductor, and thus increases the cost of the die.

A conventional method to further increase the total metal length of an inductor is metal series stacking. FIG. 4 illustrates an inductor 400 that includes three different metal layers 402, 404, 406 that are formed in the metal layers M1-Mn of the BEOL section 106. The metal layers 402 and 404 are separated by a distance 412, and the metal layers 404 and 406 are separated by a distance 414. The metal layers 402, 404, 406 are connected in series by vertical connectors 408 and 410. The three-layer inductor 400 has a first input 416 on the metal layer 402 and a second input 418 on the metal layer 406. The second input 418 may be brought out to the same side of the inductor structure as the first input 416 using a metal lead on another layer similar to the lead 310 shown in FIG. 3. The distances 412, 414 between the metal layers 402, 404, 406 are very small (for example 2-3 µm) relative to the diameter of the spiral shapes (for example 200 µm) on each of the metal layers 402, 404, 406. Thus, the lengths of the vertical connectors 408 and 410 contribute only a negligible amount to the overall inductor length. The total metal length of the inductor 400 is approximately 3 times greater than the total metal length of the inductor 300. However, the three layer inductor 400 conventionally has an inductance value that is less than 3 times greater than the inductance value of the inductor 300 because the total inductance is decreased due to magnetic field cancellation between the multiple layers. Thus, the ability to increase the inductance value using metal stacking is limited due to process constraints for the BEOL section 106.

Note that for any of the above inductor configurations, the inductance is a function of the total metal conductor length. Thus the inductor size is the same regardless of the technology. Each metal layer used for these inductors could alternatively provide space for billions or more transistors. In addition, because the inductive areas of the inductors are substantially parallel with respect to other trace layers, they can have unfavorable electromagnetic interference (EMI) effects on other components within the integrated circuit and/or their inductor characteristics can be adversely affected by adjacent conductors.

These issues for inductors are multiplied in the case of transformers which are made up of two or more inductors. An exemplary implementation of a transformer 500 in the BEOL section of a chip is illustrated in FIG. 5. The chip includes a BEOL section 502, where the transformer 500 is implemented, and a FEOL section 504. The FEOL section 504 includes the substrate 506 and various upper layers deposited on top of the substrate 506 for doping and other purposes where the active devices of the chip are usually located. The transformer 500 includes a first inductor 510 and a second inductor 512 that are inductively coupled. In this implementation, the metal layers in the BEOL section 502 get progressively thicker to tune the inductance values of the first inductor 512 and the second inductor 512. For clarity, the right-hand side of FIG. 5 shows a symbolic representation of the transformer 500. The first inductor 510 has a first input P1 for connection to a circuit on the chip and a second input coupled to ground. The second inductor 512 has a first input P2 for connection to another circuit on the chip and a second input that is also coupled to ground. The symbolic representation also illustrates the inductive coupling in the transformer 500 between the first inductor 510 and the second inductor 512. Similar to the inductors illustrated above, this transformer implementation consumes a significant amount of area which is very costly.

Thus, it would be desirable to have a new type of inductor for use in transformers and integrated circuits that can create higher inductance values in less space, that can take advantage of smaller feature size advancements, or that has less electromagnetic interference effects on other components within the integrated circuit.

SUMMARY

A three-dimensional on-chip inductor using through-silicon vias (TSVs) can be used in integrated circuits and transformers. The three-dimensional on-chip inductor can create higher inductance in less space and thus free-up a lot of valuable on-chip resources. The three-dimensional on-chip inductor can take advantage of smaller feature size advancements and shrink with new technologies. The three-dimensional on-chip inductor has a vertical aspect due to the integration of TSVs and can have less electromagnetic interference effects on other components within the integrated circuit: The TSVs of the three-dimensional on-chip inductor can also be shielded to reduce electromagnetic interference effects on surrounding components.

The three-dimensional on-chip inductor includes a plurality of segments of a first metal layer, a plurality of segments of a second metal layer, a first inductor input, a second inductor input, and a plurality of through silicon vias coupling the plurality of segments of the first metal layer and the plurality of segments of the second metal layer. The plurality of through silicon vias and segments form a continuous, non-intersecting path between the first inductor input and the second inductor input. The first metal layer can be a metal layer in the back-end-of-line section of the chip. The second metal layer can be located in a redistributed design layer of the chip.

The three-dimensional on-chip inductor can have a symmetric or asymmetric geometry. In a symmetric geometry, the first and second inductor inputs are located in one of the first metal layer and the second metal layer, and the on-chip inductor has a symmetric geometry around a symmetry line passing between the first and second inductor inputs. In an asymmetric geometry, the first inductor input is located in one of the first metal layer and the second metal layer, and the second inductor input is located in another metal layer.

The plurality of through silicon vias can be distributed in a regular array pattern. The regular array pattern of through silicon vias can be surrounded by a perimeter comprising a plurality of grounded through silicon vias, wherein the plurality of grounded through silicon vias are coupled to ground. These grounded through silicon vias can significantly reduce electromagnetic interference by the inductor on surrounding devices in the chip.

A three dimensional on-chip transformer is also disclosed. The three dimensional on-chip transformer includes a first on-chip inductor and a second on-chip inductor. Each of the first and second on-chip inductors includes a plurality of first segments in a first metal layer, a plurality of second segments in a second metal layer, a first inductor input, a second inductor input, and a plurality of through silicon vias coupling the plurality of first segments and the plurality of second segments to form a continuous, non-intersecting path between the first inductor input and the second inductor input. The first on-chip inductor is inductively coupled to the second on-chip inductor, and the first on-chip inductor is not physically coupled to the second on-chip inductor except through ground. The first and second inductor inputs can be located in one of the first metal layer and the second metal layer. The first metal layer can be one of the metal layers in the back-end-of-line section of the chip. The second metal layer can be located in a redistributed design layer of the chip. The plurality of through silicon vias of the first on-chip inductor can be distributed in a regular array pattern, and the plurality of through silicon vias of the second on-chip inductor can be distributed in a regular array pattern. The through silicon vias can also be shielded to reduce electromagnetic interference on surrounding devices.

A three-dimensional on-chip radio frequency amplifier is also disclosed. The three-dimensional on-chip radio frequency amplifier includes a first on-chip transformer, a second on-chip transformer, and a first on-chip transistor. The first on-chip transformer includes a first on-chip inductor and a second on-chip inductor. The second on-chip transformer includes a third on-chip inductor and a fourth on-chip inductor. The first on-chip transistor includes a gate, a drain and a source. Each of the first, second, third and fourth on-chip inductors includes a plurality of first segments in a first metal layer; a plurality of second segments in a second metal layer; a first inductor input, a second inductor input, and a plurality of through silicon vias coupling the plurality of first segments and the plurality of second segments to form a continuous, non-intersecting path between the first inductor input and the second inductor input. The first on-chip inductor is inductively coupled to the second on-chip inductor, the third on-chip inductor is inductively coupled to the fourth on-chip inductor, and the first, second, third and fourth on-chip inductors are not physically coupled to one another except through ground. The first inductor input of the second on-chip inductor is coupled to the gate of the first on-chip transistor. The first inductor input of the third on-chip inductor is coupled to the drain of the first on-chip transistor. The second inductor input of the first, second, third and fourth on-chip inductors are coupled to ground. The source of the on-chip transistor is coupled to ground. The first and second inductor inputs can be located in one of the first metal layer and the second metal layer. The first metal layer can be a metal layer in the back-end-of-line section of the chip. The second metal layer can be located in a redistributed design layer of the chip. The plurality of through silicon vias of each of the on-chip inductors can be distributed in a regular array pattern and can be shielded.

The three-dimensional on-chip amplifier can also include a fifth inductor, a sixth inductor and a second on-chip transistor which includes a gate, a drain and a source. The gate of the second on-chip transistor can be coupled to the drain of the first on-chip transistor; the drain of the second on-chip transistor can be coupled to the first inductor input of the third on-chip inductor, the source of the second on-chip transistor can be coupled to ground; the first inductor inputs of the fifth and sixth on-chip inductors can be coupled to a supply voltage; the second inductor input of the fifth inductor can be coupled to the drain of the first on-chip transistor; and the second inductor input of the sixth inductor can be coupled to the drain of the second on-chip transistor. Each of the fifth and sixth on-chip inductors can include a plurality of first segments in a first metal layer, a plurality of second segments in a second metal layer and a plurality of through silicon vias coupling the plurality of first segments and the plurality of second segments to form a continuous, non-intersecting path between the first inductor input and the second inductor input of the fifth and sixth inductors, respectively. The first and second inductor inputs of the fifth inductor are located in one of the first metal layer and the second metal layer. The first and second inductor inputs of the sixth inductor are located in one of the first metal layer and the second metal layer.

For a more complete understanding of the present disclosure, reference is now made to the following detailed description and the accompanying drawings.

DETAILED DESCRIPTION

Figure 1:
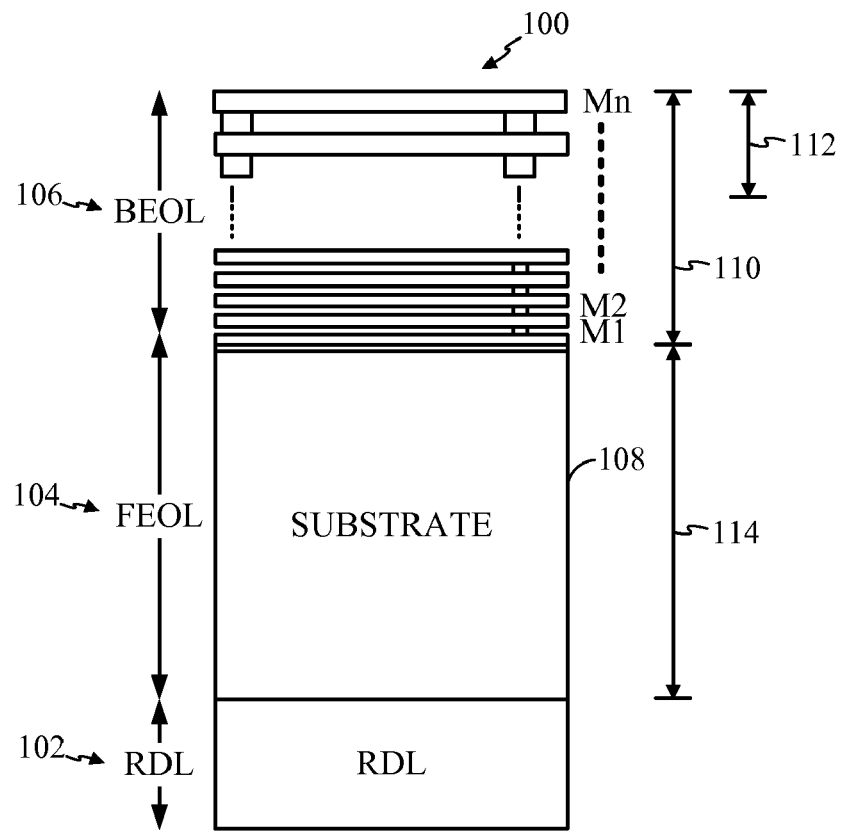
FIG. 1 is a schematic of a cross-section of a CMOS device.
Figure 2:
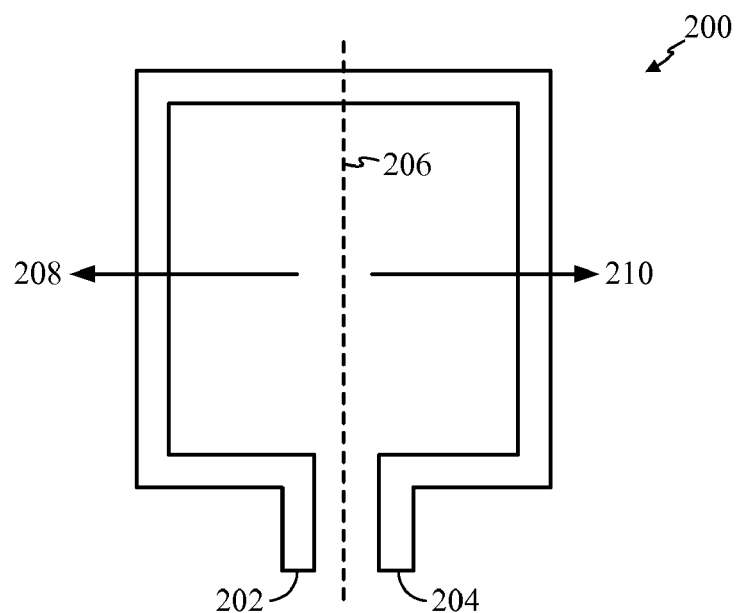
FIG. 2 is a schematic top view of a symmetric two-dimensional inductor.
Figure 6:
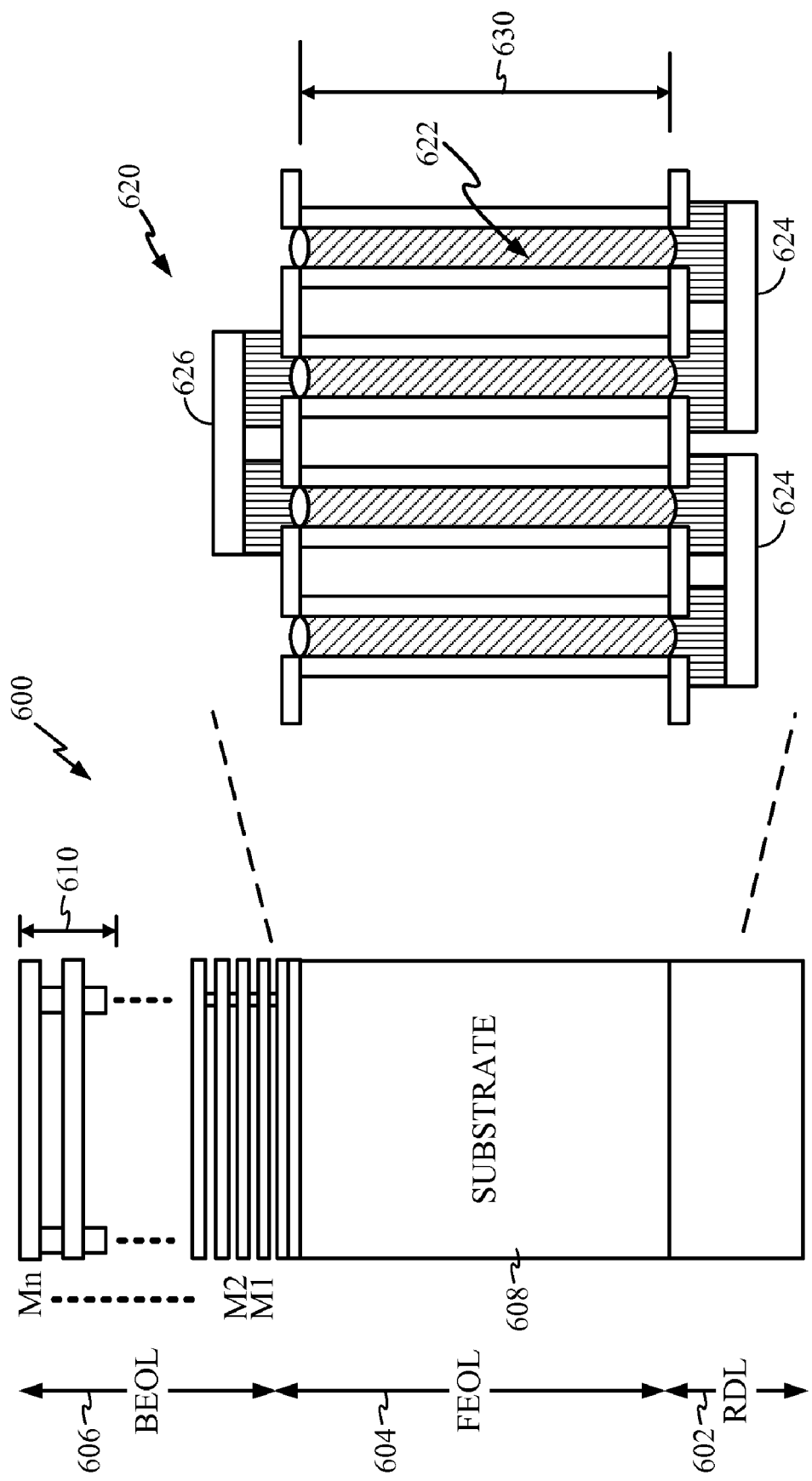
FIG. 6 is a schematic front view of a cross-section of a CMOS device showing through-silicon vias connecting conducting segments in the first metal layer of the back end of line section to conducting segments in the RDL section.

Similar to FIG. 1, FIG. 6 shows a cross-section of CMOS technology 600 which includes three sections: a Redistributed Design Layer (RDL) section 602, a Front-End-Of-the-Line (FEOL) section 604, and a Back-End-Of-the-Line (BEOL) section 606. The FEOL section 604 includes a substrate 608 with several top layers for active devices and the BEOL section 606 includes a plurality of metal layers M1-Mn of which a portion 610 are available for conventional inductors. The height of the FEOL section 604 is much greater than the height available for inductors 610 in the BEOL section 606. In one non-limiting exemplary embodiment, the FEOL section 604 can have a height on the order of 200 μm while the height available for inductors 610 in the BEOL section 606 can be on the order of 10 μm.

FIG. 6 also shows an exploded front view of an exemplary embodiment of an inductor 620 which includes the integration of a plurality of vertical through-silicon vias (TSVs) 622. The inductor 620 is primarily located in the FEOL section 604 of the CMOS technology 600 and extends into the RDL section 602 and the BEOL section 606 as explained below. The TSVs 622 pass through the substrate 608 and couple the RDL section 602 and the M1 layer of the BEOL section 606. The TSV height 630 can be fifty times greater than the inductor available height 610 in the BEOL section 606. The TSVs 622 increase the total length of the inductor 620 which increases the inductance value, since the inductor serialized-length is directly proportional to the inductance value. The top of each TSV may be coupled to other TSVs with metal segments 626 in the M1 metal layer and the bottom of each TSV may be coupled to other TSVs with metal segments 624 in the RDL section 602 in a three-dimensional geometry as shown in FIG. 6.

The conventional two-dimensional on-chip inductor designs, such as inductors 200, 300 and 400, are limited to increase inductance density by increasing inductor area because the distances between metal layers in the BEOL are negligible. For example, the distances 412, 414 between the metal layers 402, 404, 406 can be 2-3 μm while the diameter of the spiral shapes on each of the metal layers 402, 404, 406 can be 200-300 μm. Therefore, the conventional inductor design is effectively limited to two-dimensional optimization. With the integration of TSVs in the inductor design, both the vertical height of the TSVs, for example 200 μm, and the horizontal pitch of the segments connecting the TSVs, for example 20 μm, can be significant. Therefore, TSV inductors can be designed and optimized in 3-dimensions.

Figure 7:
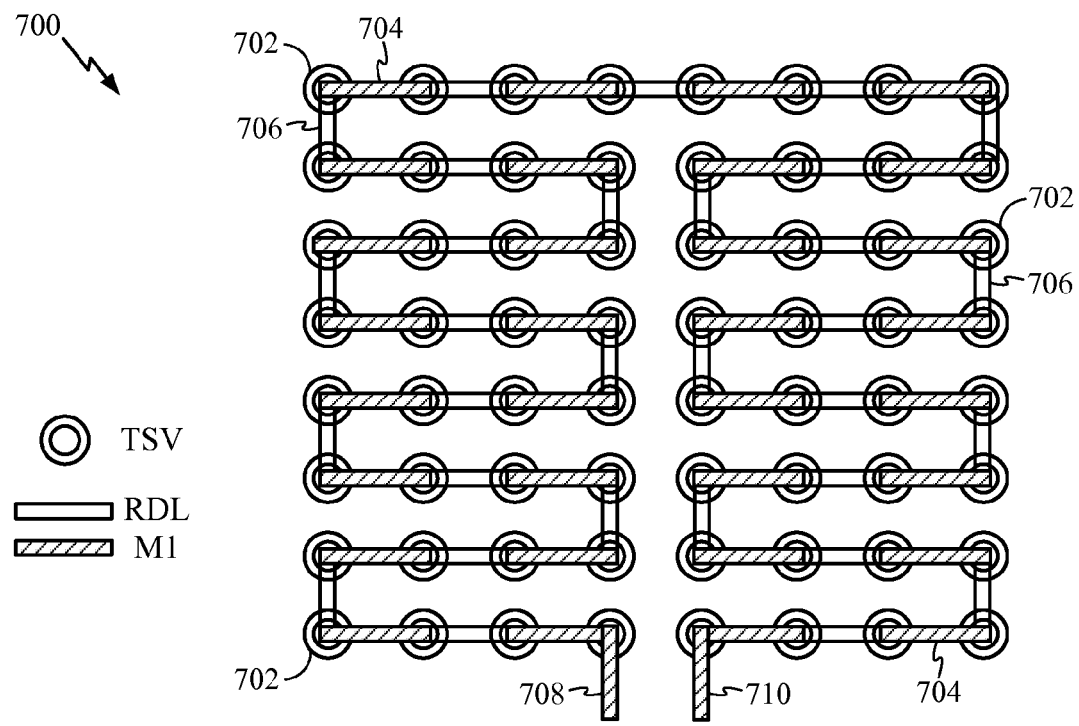
FIG. 7 is a schematic top view of a symmetric three-dimensional on-chip inductor.
Figure 8:
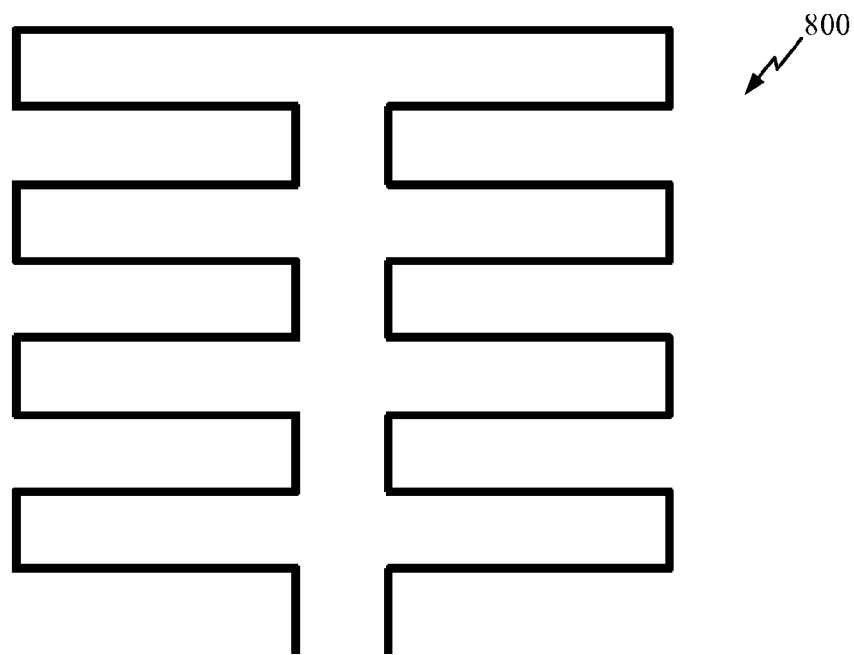
FIG. 8 is a simplified two-dimensional top view of the symmetric three-dimensional inductor of FIG. 7 illustrating its symmetry.

TSV inductors may also display substantially symmetrical geometry. FIG. 7 shows a top view of an exemplary inductor 700. The inductor 700 includes a plurality of TSVs 702 passing through a substrate, a plurality of M1 segments 704 in the M1 layer of the BEOL section, and a plurality of RDL segments 706 in the RDL section. The inductor 700 also includes a pair of inductor inputs 708, 710. Note that the inductor 700 is designed in three-dimensions; so the M1 segments 704 and the RDL segments 706 are separated vertically by the thickness or height of the FEOL section 604 through which the TSVs 702 pass. The inductor 700 has a symmetric design. FIG. 8 illustrates a simplified two-dimensional shape 800 of the inductor 700 to show the symmetry of the inductor 700 around a center line passing between the inductor inputs 708, 710.

This three-dimensional TSV inductor may thus provide advantages in inductance density and symmetric geometry. The three-dimensional inductor can have symmetrical structure by a symmetrical connection of a regular TSV array with RDL and M1 interconnects, and the symmetrical positioning of the inductor inputs. The inductance density is also increased by the vertical height of the TSVs.

Figure 9:
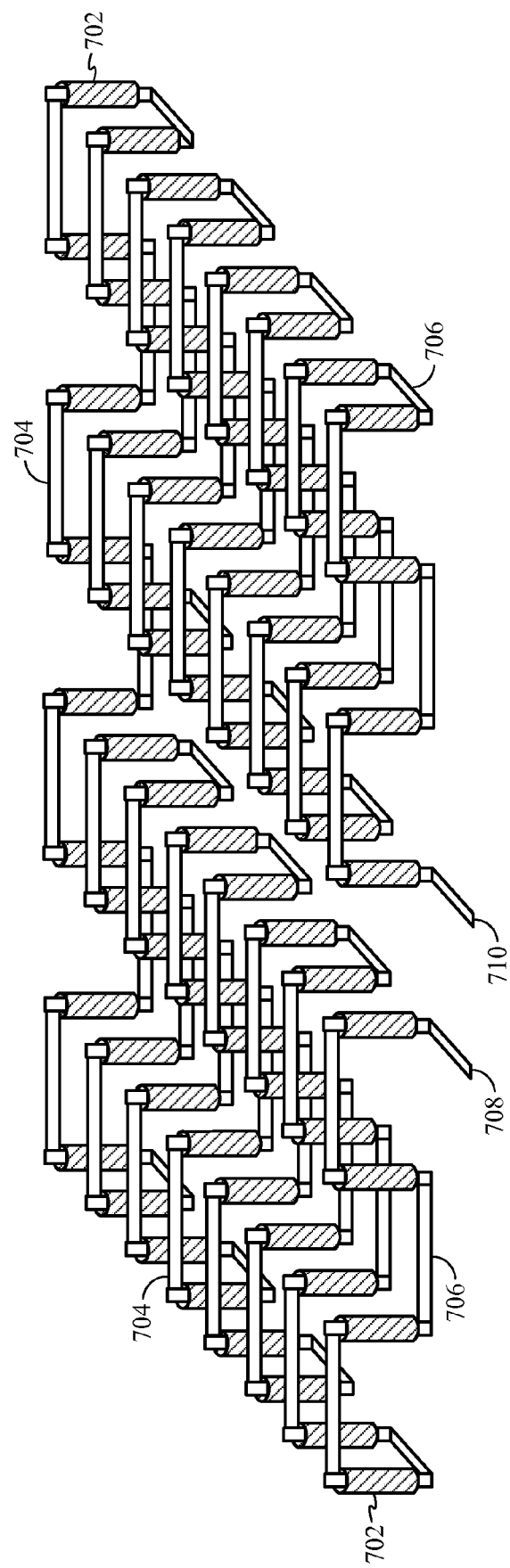
FIG. 9 is a schematic perspective view of the symmetric three-dimensional on-chip inductor of FIG. 7.

FIG. 9 shows a three-dimensional view of the inductor 700, including the plurality of TSVs 702 passing through the substrate, the plurality of M1 segments 704 in the M1 layer of the BEOL section, the plurality of RDL segments 706 in the RDL section, and the pair of inductor inputs 708, 710. Note that the TSV heights and the segment lengths are not shown to scale. Exemplary TSV heights can include 50 μm or 200 μm, and exemplary connector lengths can be 20 μm or 50 μm. In order to minimize the interference with surrounding devices, the inductor 700 can be surrounded by a similarly spaced square of TSVs coupled to ground. Other methods known to minimize electromagnetic interference may also be used.

Figure 3:
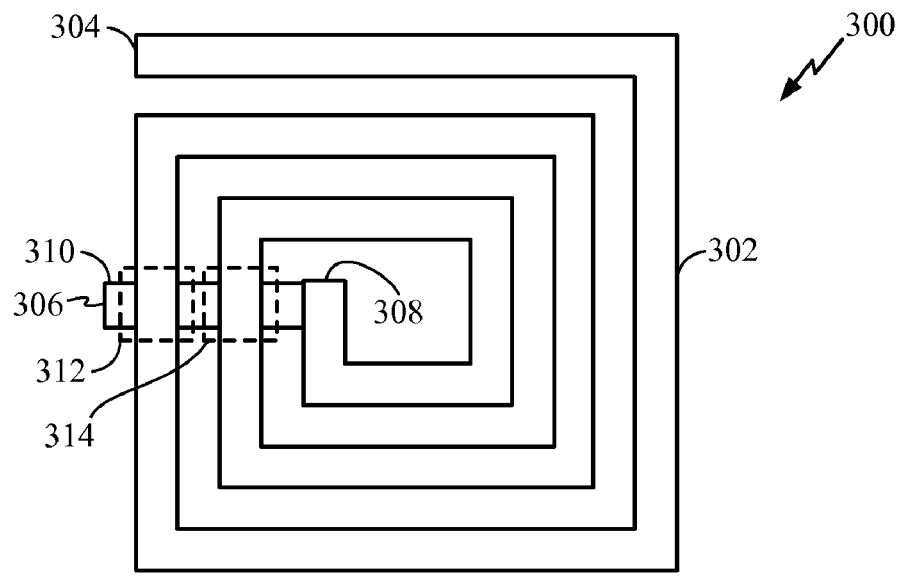
FIG. 3 is a schematic top view of a spiral, asymmetric two-dimensional inductor.
Figure 4:
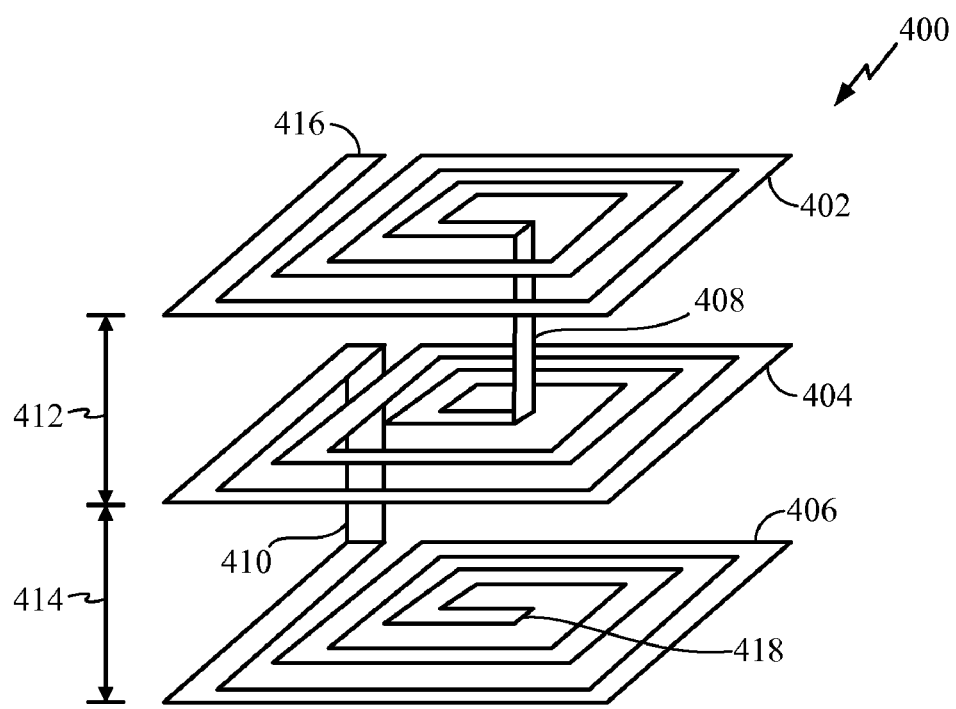
FIG. 4 is a schematic perspective view of a three layer spiral, asymmetric two-dimensional inductor.
Figure 5:
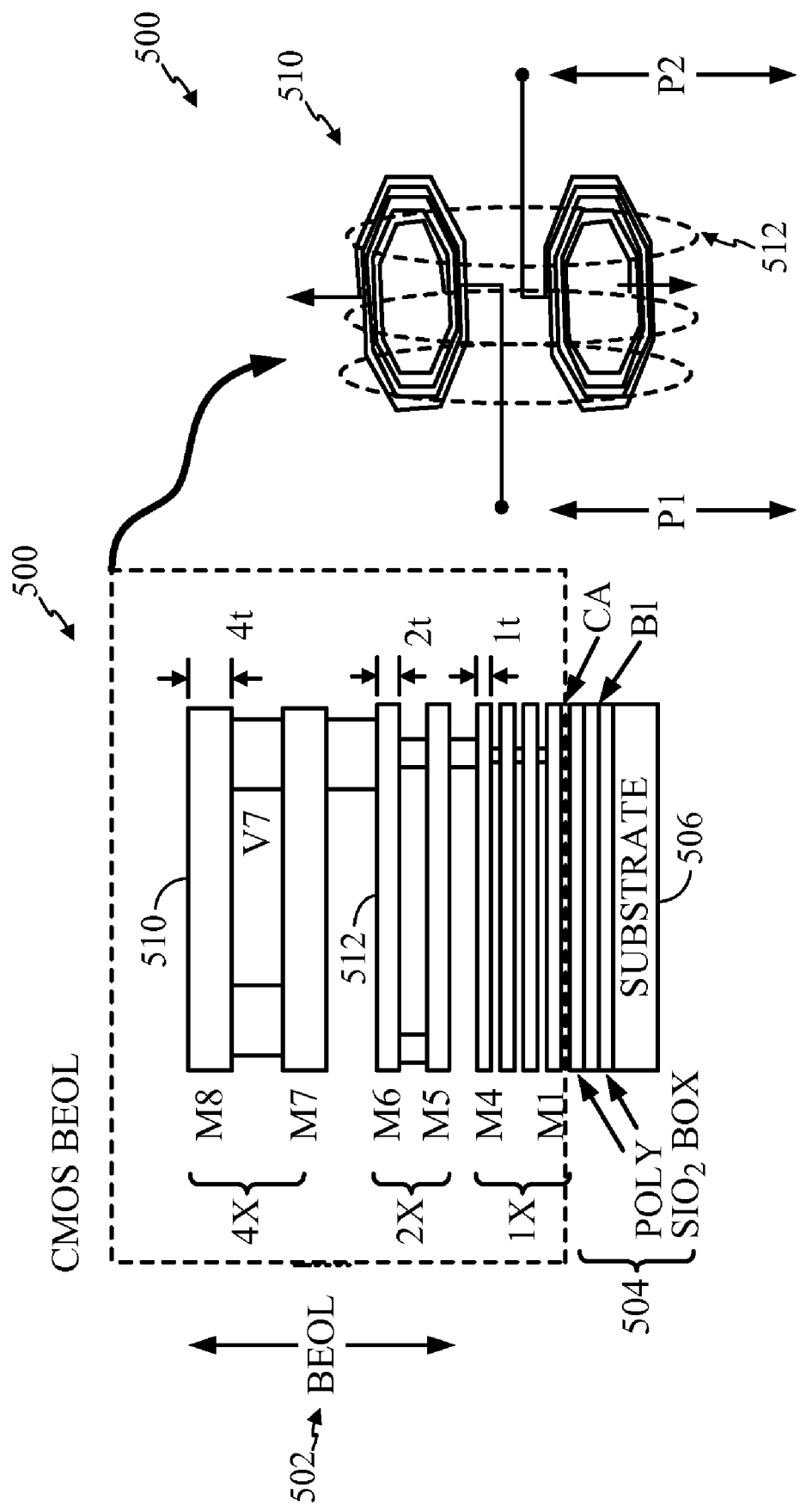
FIG. 5 is a schematic cross-section of a CMOS device that includes a transformer.

As an example and not for limitation, an exemplary inductor with the structure of the inductor 700 could have a TSV height of 100 μm, a TSV diameter of 20 μm, and M1 and RDL segments with a length of 20 μm. The inductor 700 has 64 TSVs, 32 M1 segments and 31 RDL segments. Thus, an embodiment with the above exemplary dimensions would have a total inductor length of 64*100+(32+31)*20 um which equals 7.66 mm; and would have a horizontal cross section of approximately 90 um×90 um. The inductance value of this embodiment is about 12 nH. In contrast, the spiral inductor 300 in FIG. 3, with an exemplary horizontal cross section of 200 um×200 um takes up more than 4 times the area of the three-dimensional TSV inductor, and depending on trace thickness and spacing, would typically have an inductance of about 0.64 nH.

Figure 10:
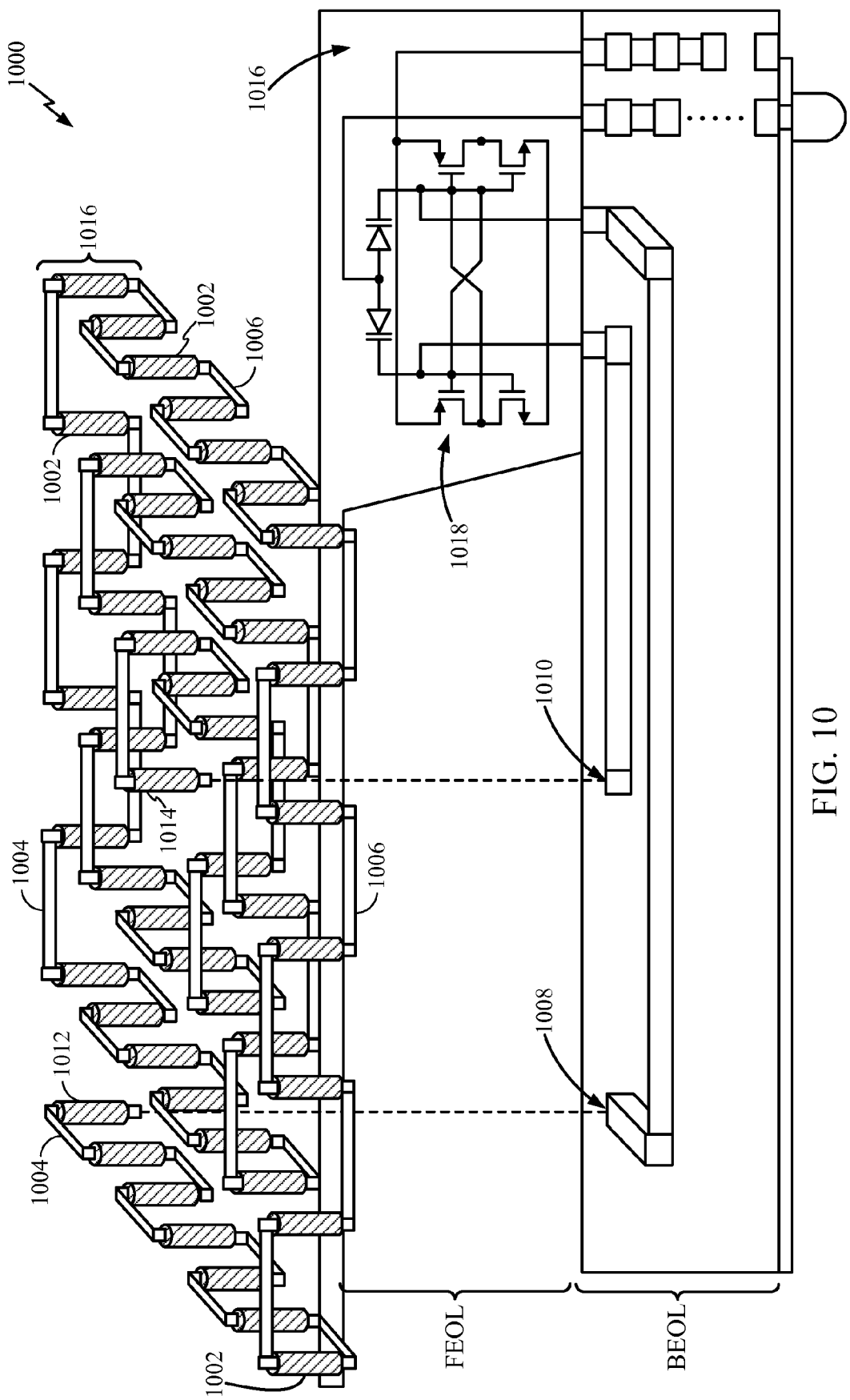
FIG. 10 is a schematic perspective view of an asymmetric three-dimensional on-chip inductor showing its coupling to a circuit in the substrate of the chip.

FIG. 10 shows a three-dimensional view of an alternative non-symmetric inductor 1000. The inductor 1000 includes a plurality of TSVs 1002, a plurality of M1 segments 1006 in the M1 layer of the BEOL section (bottom), and a plurality of RDL segments 1004 in the RDL section (top). The inductor 1000 also includes a first inductor input 1008 and a second inductor input 1010 in the BEOL section. The top portion of FIG. 10 shows the inductor 1000 removed from the chip, and the bottom portion of the figure illustrates the connections to the inductor inputs 1008, 1010. The first inductor input 1008 is coupled to the TSV 1012, and the second inductor input 1010 is coupled to the TSV 1014. Note that the inductor 1000 has an asymmetric spiral shape. The inductor inputs 1008, 1010 are coupled to circuitry 1018 in the substrate 1016. The TSVs 1002 also pass through the substrate 1016. The M1 segments 1006 are in the M1 layer of the BEOL section and at least the inductor input 1010 coupled to the center TSV 1014 is in another metal layer of the BEOL section. The circuitry 1018 can then be coupled to one or more metal layers in the BEOL section.

Figure 11:
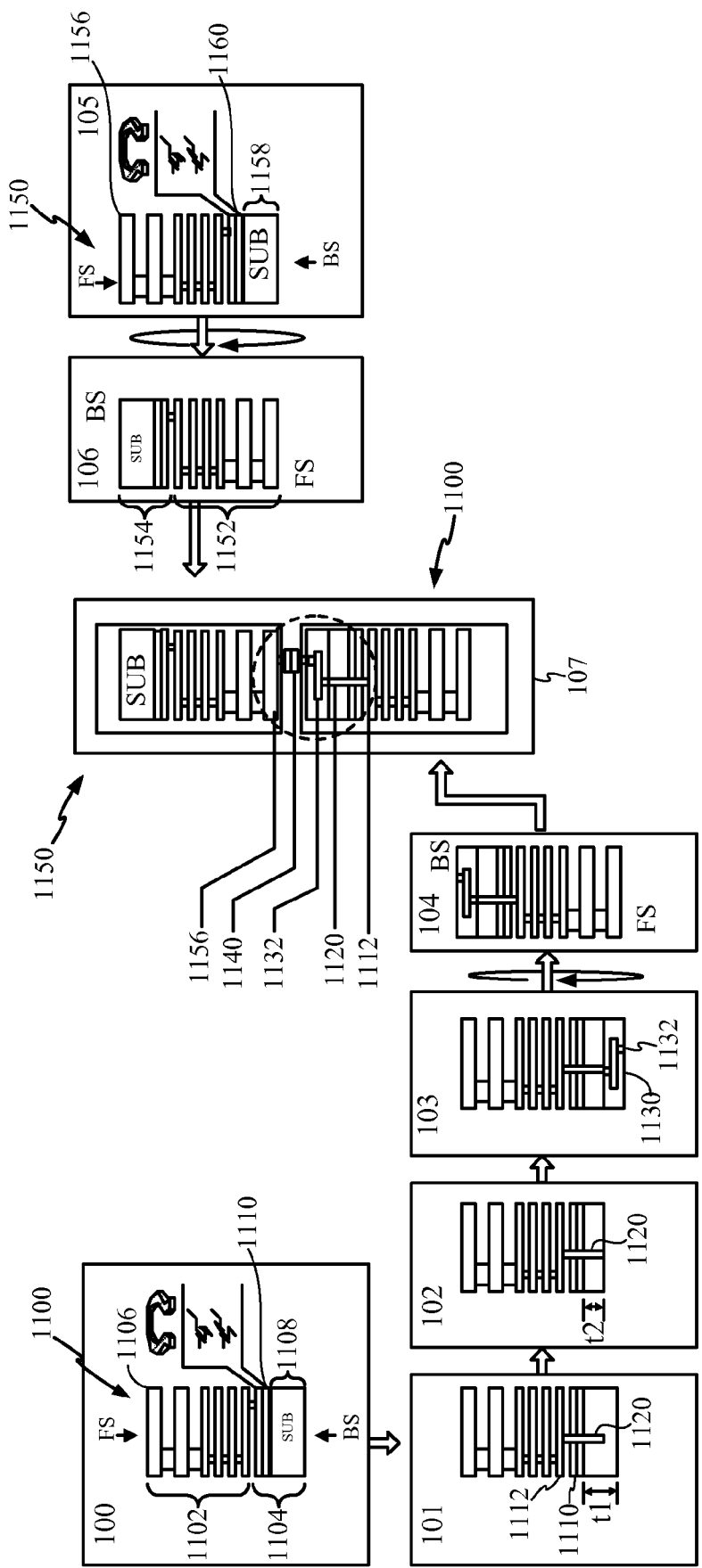
FIG. 11 illustrates a three dimensional die stacking technique to interconnect two dies.

FIG. 11 shows a method of three-dimensional die stacking to obtain higher density with inductors and transformers. This die stacking technique starts with a first die 1100 in block 100 on the upper left of FIG. 11, and a second die 1150 in block 105 on the right side of FIG. 11.

The first die 1100 includes a BEOL section 1102 and a FEOL section 1104. The FEOL section 1104 includes a substrate 1108 and upper layers 1110 in which a plurality of active devices is implemented. The BEOL section 1102 includes a plurality of metal layers including a first metal layer 1112 nearest the substrate 1108 and a top metal layer 1106 furthest from the substrate 1108 where at least one metal layer includes an inductor. The BEOL section 1102 is at the front-side (FS) of the first die 1100 and the substrate 1108 of the FEOL section 1104 is currently at the back-side (BS) of the first die 1100.

Block 101 shows a through-silicon via (TSV) 1120 trenched through the upper layers 1110 and a portion of the substrate 1108 of the FEOL section 1104. In this block, the substrate 1108 has a thickness t1. The top of the TSV 1120 is coupled to the first metal layer 1112 in the BEOL section 1102.

Block 102 shows the first die 1100 after substrate thinning. The substrate thinning process reduces the thickness of the substrate 1108 from thickness t1 to a thickness t2. The substrate thinning process exposes the bottom end of the TSV 1120 at the bottom of the substrate 1108.

Block 103 shows the first die 1100 after addition of an RDL layer 1130 at the bottom of the substrate 1108. The RDL section 1130 is now at the back-side of the first die 1100. The RDL section 1130 includes conductors that couple the bottom end of the TSV 1120 to a signal input 1132 at the back side of the die 1100 forming a conductive path from the signal input 1132 through the RDL section 1130 and the TSV 1120 to the first metal layer 1112 in the BEOL section 1102.

Block 104 shows flipping of the first die 1100 so that the metal layers of the BEOL section 1102 at the front-side of the first die 1100 are now at the bottom, and the RDL section 1130 at the back side of the first die 1100 is now at the top.

Block 105 shows the second die 1150 which includes a BEOL section 1152 and a FEOL section 1154. The BEOL section 1152 includes a plurality of metal layers including a top metal layer 1156 furthest from the substrate 1158 where at least one metal layer includes an inductor. The FEOL section 1154 includes a substrate 1158 and upper layers 1160 in which a plurality of active devices is implemented. The BEOL section 1152 is at the front-side (FS) of the second die 1150 and the substrate 1158 of the FEOL section 1154 is at the back-side (BS) of the second die 1150.

Block 106 shows flipping of the second die 1150 so that the metal layers of the BEOL section 1152 at the front-side of the second die 1150 are now at the bottom, and the substrate 1158 at the back side of the second die 1150 is now at the top.

Block 107 shows connection of the front side of the second die 1150 to the back side of the first die 1100 using a micro-bump 1140. The micro-bump 1140 provides a conductive path coupling the signal input 1132 of the RDL section 1130 at the back side of the first die 1100 to the top metal layer 1156 in the BEOL section 1152 at the front side of the second die 1150.

Thus, this three-dimensional die stacking technique provides a conductive path that can be used to couple an inductor or transformer in the top metal layers 1156 of the second die 1150 to the first metal layer 1110 of the first die 1100 through the metal bump 1140 and through the RDL section 1130 and the TSV 1120 of the first die 1100.

Figure 12:
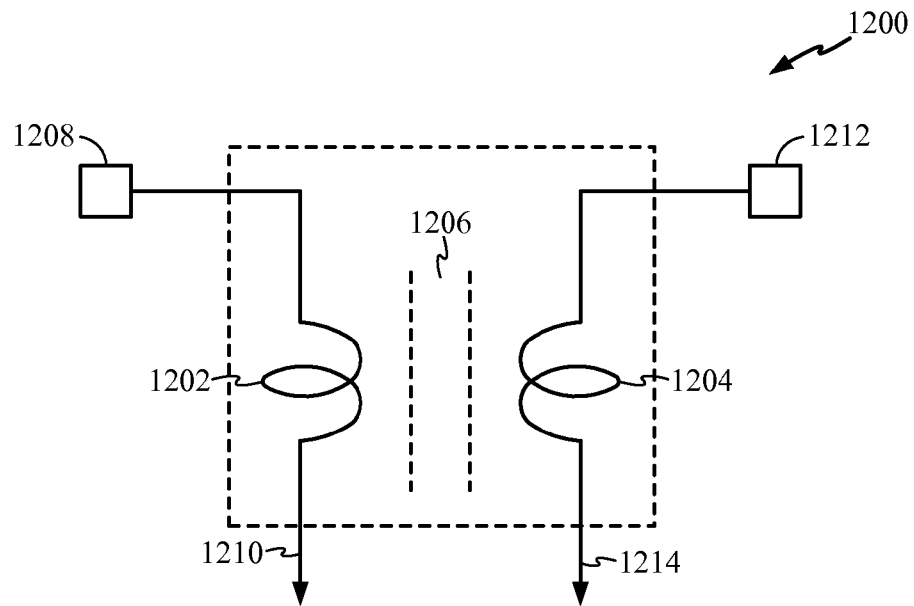
FIG. 12 illustrates a transformer.

FIG. 12 illustrates a transformer 1200 which includes a first inductor 1202 and a second inductor 1204. The inductance value is mainly proportional to the inductor length and a transformer requires two inductors plus more chip area for the electromagnetic coupling structure. The first inductor 1202 has a first input 1208 and a second input 1210; the first input 1208 can be coupled to a primary circuit (not shown) and the second inductor input 1210 is coupled to ground. The second inductor 1204 has a first input 1212 and a second input 1214; the first input 1212 can be coupled to a load (not shown) and the second inductor input 1214 is coupled to ground. The first inductor 1202 is physically separated from the second inductor 1204 in a way that promotes electromagnetic coupling 1206 between the two inductors such that a varying current in the first inductor 1202 induces a varying voltage in the second inductor 1204 which causes energy to flow from the primary circuit through the transformer 1200 to the load. Different materials can be used to enhance the coupling coefficient within the transformer 1200, for example ferromagnetic materials. Some exemplary ferromagnetic materials that can enhance the coupling coefficient include nickel, cobalt, iron and mu-metal.

Figure 13:
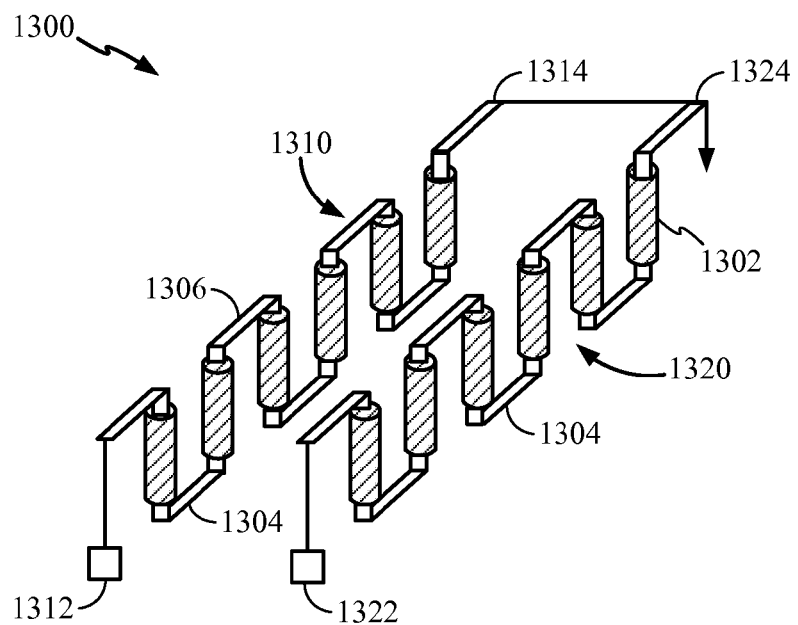
FIG. 13 is a schematic perspective view of a three dimensional on-chip transformer.

FIG. 13 shows an exemplary implementation of a transformer 1300 using inductors that include through-silicon vias (TSVs). The transformer 1300 includes a first inductor 1310 and a second inductor 1320. Each of the first inductor 1310 and the second inductor 1320 includes a plurality of TSVs 1302 that pass through the substrate of a chip (see for example FIG. 6) that are coupled at the top end by M1 segments 1306 in the M1 layer of the BEOL section and at the bottom end by RDL segments 1304 in the RDL section to form a continuous path. The first inductor 1310 has a first input 1312 and a second input 1314; the first input 1312 can be coupled to a primary circuit (not shown) and the second inductor input 1314 is coupled to ground. The second inductor 1320 has a first input 1322 and a second input 1324; the first input 1322 can be coupled to a load (not shown) and the second inductor input 1324 is coupled to ground. The first inductor 1310 is physically separated from the second inductor 1320 by dielectric material in a manner that promotes electromagnetic coupling between the two inductors. The TSVs passing through the substrate increase the inductor length which increases the inductance value. The alternative connection of TSVs by RDL and M1 segments in a continuous path forms an on chip inductor, and the pair of these TSV inductors forms a transformer.

Figure 14:
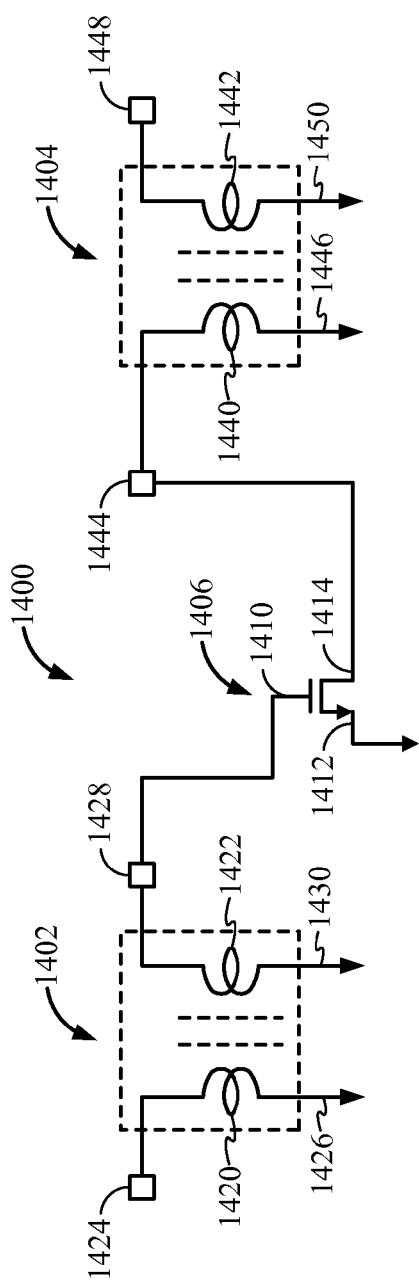
FIG. 14 illustrates a radio frequency amplifier.

An exemplary application of a transformer is in a radio frequency (RF) amplifier 1400, shown in FIG. 14, which can be used in RF integrated circuits. The RF amplifier 1400 includes a first transformer 1402 and a second transformer 1404 coupled together by a transistor 1406. The transistor 1406 has a gate 1410, a source 1412 and a drain 1414. The source 1412 of the transistor 1406 is coupled to ground.

The first transformer 1402 includes a first inductor 1420 that is inductively coupled to a second inductor 1422. The first inductor 1420 has a first input 1424 and a second input 1426; the first input 1424 can be coupled to an RF input and the second inductor input 1426 is coupled to ground. The second inductor 1422 has a first input 1428 and a second input 1430; the first input 1428 is coupled to the gate 1410 of the transistor 1406 and the second inductor input 1430 is coupled to ground.

The second transformer 1404 includes a third inductor 1440 inductively coupled to a fourth inductor 1442. The third inductor 1440 has a first input 1444 and a second input 1446; the first inductor input 1444 is coupled to the drain 1414 of the transistor 1406 and the second inductor input 1446 is coupled to ground. The fourth inductor 1442 has a first input 1448 and a second input 1450; the first input 1448 can be used as an RF output and the second inductor input 1450 is coupled to ground. The transformers 1402 and 1404 perform the roles of signal coupling and impedance transformation due to the turn ratios between their inductors.

Figure 15:
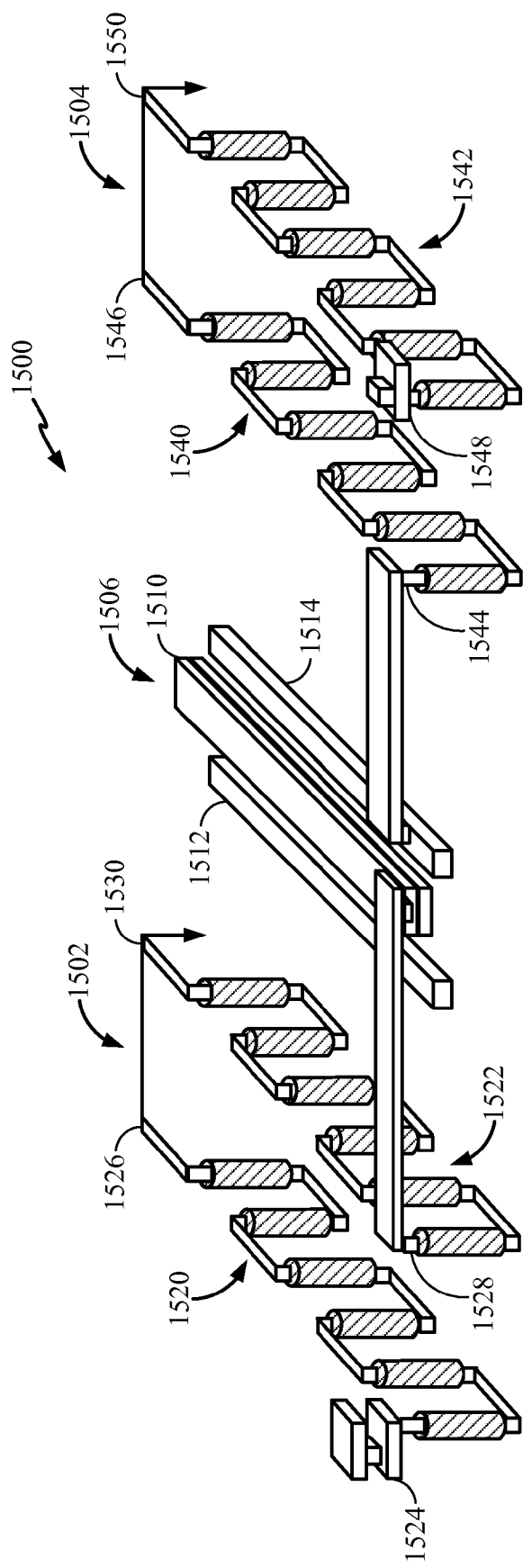
FIG. 15 is a schematic perspective view of a three dimensional on-chip radio frequency amplifier.

FIG. 15 shows an exemplary implementation of a RF amplifier 1500 using inductors that include through-silicon vias (TSVs). The RF amplifier 1500 includes a first transformer 1502 and a second transformer 1504 coupled together by a transistor 1506. The transistor 1506 has a gate 1510, a source 1512 and a drain 1514. The source 1512 of the transistor 1506 is coupled to ground.

The first transformer 1502 includes a first inductor 1520 that is inductively coupled to a second inductor 1522. Each of the first inductor 1520 and the second inductor 1522 includes a plurality of TSVs that pass through the substrate of a chip where the TSVs are coupled at the top end by segments in the M1 layer of the BEOL section and at the bottom end by segments in the RDL section to form a continuous path (see for example FIG. 12). The first inductor 1520 has a first input 1524 and a second input 1526; the first input 1524 can be coupled to an RF input and the second input 1526 is coupled to ground. The second inductor 1522 has a first input 1528 and a second input 1530; the first input 1528 is coupled to the gate 1510 of the transistor 1506 and the second inductor input 1530 is coupled to ground.

The second transformer 1504 includes a third inductor 1540 that is inductively coupled to a fourth inductor 1542. Each of the third inductor 1540 and the fourth inductor 1542 includes a plurality of TSVs that pass through the substrate of the chip where the TSVs are coupled at the top end by segments in the M1 layer of the BEOL section and at the bottom end by segments in the RDL section to form a continuous path (see for example FIG. 13). The third inductor 1540 has a first input 1544 and a second input 1546; the first input 1544 is coupled to the drain 1514 of the transistor 1506 and the second input 1546 is coupled to ground. The fourth inductor 1542 has a first input 1548 and a second input 1550; the first input 1548 can be used as an RF output and the second input 1550 is coupled to ground.

Figure 16:
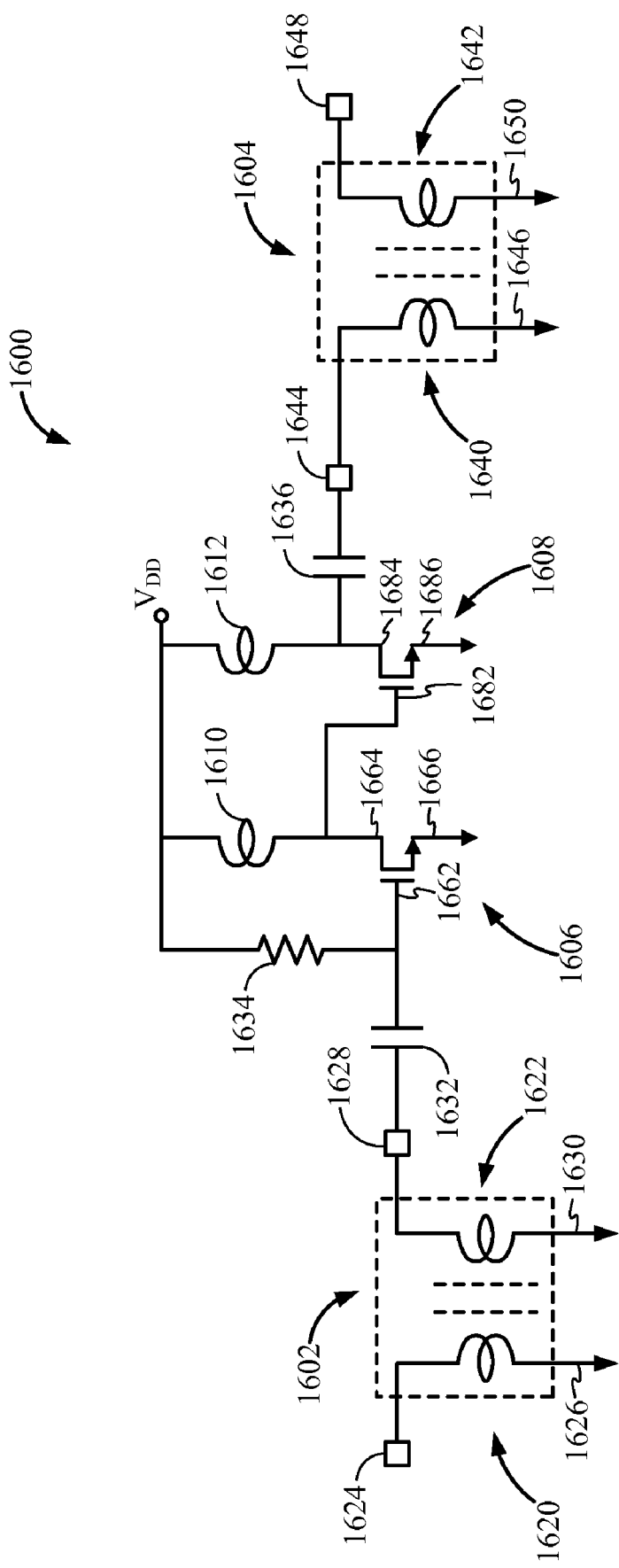
FIG. 16 illustrates a two stage amplifier that can be implemented with both three-dimensional inductors and three-dimensional transformers.

Inductors and transformers using TSVs can be used in various other applications, another example being a two-stage amplifier 1600, shown in FIG. 16. The amplifier 1600 includes a first transformer 1602 and a second transformer 1604, both of which can include TSV inductors as described above. The first transformer 1602 and the second transformer 1604 are coupled together through a first transistor 1606 and a second transistor 1608. The first transistor 1606 includes a gate 1662, a drain 1664, and a source 1666. The second transistor 1608 includes a gate 1682, a drain 1684, and a source 1686. The drain 1664 of the first transistor 1606 is coupled to a supply voltage $V_{DD}$ through a first inductor 1610, and the drain 1684 of the second transistor 1608 is coupled to the supply voltage $V_{DD}$ through a second inductor 1612. The first inductor 1610 or the second inductor 1612 can also be a TSV inductor as described above.

The first transformer 1602 includes a first inductor 1620 that is inductively coupled to a second inductor 1622. The first inductor 1620 has a first input 1624 and a second input 1626. The second inductor 1622 has a first input 1628 and a second input 1630. The first input 1624 of the first inductor 1620 is coupled to the signal input for the amplifier 1600. The first input 1628 of the second inductor 1624 is coupled to the gate 1662 of the first transistor 1606 through a first capacitor 1632. The second inductor input 1626 of the first inductor 1620 and the second input 1630 of the second inductor 1622 are both coupled to ground.

The gate 1662 of the first transistor 1606 is also coupled to the supply voltage $V_{DD}$ through a resistor 1634. The gate 1682 of the second transistor 1608 is coupled to the drain 1664 of the first transistor 1606. The source 1666 of the first transistor 1606 and the source 1686 of the second transistor 1608 are both coupled to ground.

The second transformer 1604 includes a first inductor 1640 inductively coupled to a second inductor 1642. The first inductor 1640 has a first input 1644 and a second input 1646. The second inductor 1642 has a first input 1648 and a second input 1650. The first input 1644 of the first inductor 1640 is coupled to the drain 1684 of the second transistor 1608 through a second capacitor 1636. The first input 1648 of the second inductor 1642 can be used as an output of the two-stage amplifier 1600. The second input 1646 of the first inductor 1640 and the second input 1650 of the second inductor 1642 are both coupled to ground. The transformers 1602 and 1604 perform the roles of signal coupling and impedance transformation due to the turn ratios between their inductors.

Figure 17:
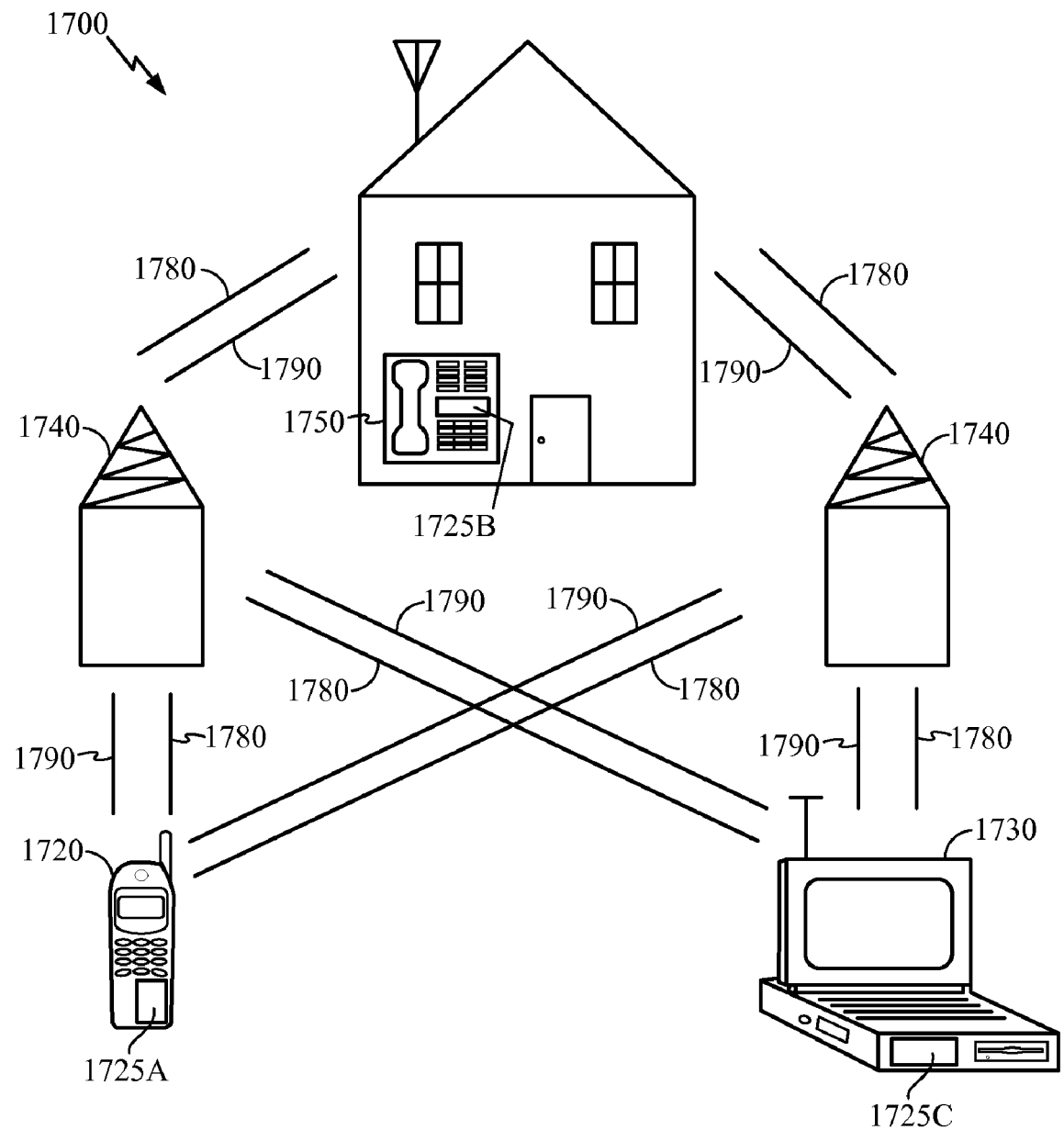
FIG. 17 is a block diagram showing an exemplary wireless communication system in which a three-dimensional inductor transformer or other devices based thereon may be advantageously employed.

FIG. 17 shows an exemplary wireless communication system 1700 in which an embodiment of an inductor or transformer implemented using a plurality of through-silicon vias (TSVs) may be advantageously employed, where the TSVs are inter coupled to form a continuous conductive path using conductive segments in a metal layer of the BEOL section and conductive segments in the RDL section of a die. The inductors implemented using TSVs can have a symmetric or an asymmetric geometry. For purposes of illustration, FIG. 17 shows three remote units 1720, 1730, and 1750 and two base stations 1740. It should be recognized that typical wireless communication systems may have many more remote units and base stations. Any of remote units 1720, 1730, and 1750 may include a memory power management system supporting multiple power modes such as disclosed herein. FIG. 17 shows forward link signals 1780 from the base stations 1740 and the remote units 1720, 1730, and 1750 and reverse link signals 1790 from the remote units 1720, 1730, and 1750 to base stations 1740.

In FIG. 17, remote unit 1720 is shown as a mobile telephone, remote unit 1730 is shown as a portable computer, and remote unit 1750 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 17 illustrates certain exemplary remote units that may include a memory power management system supporting multiple power modes as disclosed herein, the memory power management system is not limited to these exemplary illustrated units. Embodiments may be suitably employed in any electronic device in which a memory power management system supporting multiple power modes is desired.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A three dimensional on-chip inductor comprising:
   a substrate having a top side and a bottom side, the top side being opposite the bottom side;
   a plurality of segments of a first metal layer, the first metal layer being above the top side of the substrate;
   a plurality of segments of a second metal layer, the second metal layer being below the bottom side of the substrate;
   a first inductor input and a second inductor input; and
   a plurality of through silicon vias extending from the top side of the substrate to the bottom side of the substrate and coupling the plurality of segments of the first metal layer and the plurality of segments of the second metal layer to form a continuous, non-intersecting path between the first inductor input and the second inductor input.

2. The on-chip inductor of claim 1, wherein the first metal layer is located in a back-end-of-line section of the chip.

3. The on-chip inductor of claim 1, wherein the second metal layer is located in a redistributed design layer section of the chip.

4. The on-chip inductor of claim 3, wherein the first metal layer is located in a back-end-of-line section of the chip.

5. The on-chip inductor of claim 1, wherein the first and second inductor inputs are located in one of the first metal layer and the second metal layer, and the on-chip inductor has a symmetric geometry around a symmetry line passing between the first and second inductor inputs.

6. The on-chip inductor of claim 1, wherein the on-chip inductor has an asymmetric geometry.

7. A three dimensional on-chip inductor comprising:
   a plurality of segments of a first metal layer;
   a plurality of segments of a second metal layer;
   a first inductor input and a second inductor input; and
   a plurality of through silicon vias coupling the plurality of segments of the first metal layer and the plurality of segments of the second metal layer to form a continuous, non-intersecting path between the first inductor input and the second inductor input;

wherein the first inductor input is located in one of the first metal layer and the second metal layer, and the second inductor input is located in a third metal layer.

8. The on-chip inductor of claim 1, wherein the plurality of through silicon vias are distributed in a regular array pattern.

9. The on-chip inductor of claim 8, wherein the regular array pattern of through silicon vias are surrounded by a perimeter comprising a plurality of through silicon vias coupled to ground.

10. A three dimensional on-chip transformer comprising:
a substrate having a top side and a bottom side, the top side being opposite the bottom side;
a first on-chip inductor and a second on-chip inductor, each of the first and second on-chip inductors comprising
a plurality of first segments in a first metal layer, the first metal layer being above the top side of the substrate;
a plurality of second segments in a second metal layer, the second metal layer being below the bottom side of the substrate;
a first inductor input and a second inductor input, the first and second inductor inputs being located in one of the first metal layer and the second metal layer; and
a plurality of through silicon vias extending from the top side of the substrate to the bottom side of the substrate and coupling the plurality of first segments and the plurality of second segments to form a continuous, non-intersecting path between the first inductor input and the second inductor input;
the first on-chip inductor being inductively coupled to the second on-chip inductor, and the first on-chip inductor not being physically coupled to the second on-chip inductor except through ground.

11. The on-chip transformer of claim 10, wherein the first metal layer is located in a back-end-of-line section of the chip.

12. The on-chip transformer of claim 10, wherein the second metal layer is located in a redistributed design layer section of the chip.

13. The on-chip transformer of claim 12, wherein the first metal layer is located in a back-end-of-line section of the chip.

14. The on-chip transformer of claim 10, wherein the plurality of through silicon vias of the first on-chip inductor are distributed in a regular array pattern, and the plurality of through silicon vias of the second on-chip inductor are distributed in a regular array pattern.

15. The on-chip transformer of claim 14, wherein an outside of the regular array pattern of through silicon vias of the first and second on-chip inductors is surrounded by a perimeter comprising a plurality of through silicon vias coupled to ground, wherein the outside of the regular array pattern of through silicon vias of the first and second on-chip inductors is on the sides of the first and second on-chip inductors that are away from the inductive coupling between the first and second on-chip inductors.

16. A three dimensional on-chip electronic device comprising:
a substrate having a top side and a bottom side, the top side being opposite the bottom side;
a first on-chip inductor comprising a first plurality of first layer segments in a first metal layer, the first metal layer being above the top side of the substrate, a first plurality of second layer segments in a second metal layer, the second metal layer being below the bottom side of the substrate, a first inductor input and a first inductor output, and a first plurality of through silicon vias extending from the top side of the substrate to the bottom side of the substrate and coupling the first plurality of first layer segments and the first plurality of second layer segments to form a continuous, non-intersecting path between the first inductor input and the first inductor output, the first inductor input and the first inductor output being located in one of the first metal layer and the second metal layer, the first inductor output being coupled to ground; and
a second on-chip inductor comprising a second plurality of first layer segments in the first metal layer, a second plurality of second layer segments in the second metal layer, a second inductor input and a second inductor output, and a second plurality of through silicon vias extending from the top side of the substrate to the bottom side of the substrate and coupling the second plurality of first layer segments and the second plurality of second layer segments to form a continuous, non-intersecting path between the second inductor input and the second inductor output, the second inductor input and the second inductor output being located in one of the first metal layer and the second metal layer, the second inductor output being coupled to ground;
the first on-chip inductor being inductively coupled to the second on-chip inductor, and the first on-chip inductor not being physically coupled to the second on-chip inductor except through ground.

17. The three dimensional on-chip electronic device of claim 16, further comprising:
a third on-chip inductor comprising a third plurality of first layer segments in the first metal layer, a third plurality of second layer segments in the second metal layer, a third inductor input and a third inductor output, and a third plurality of through silicon vias coupling the third plurality of first layer segments and the third plurality of second layer segments to form a continuous, non-intersecting path between the third inductor input and the third inductor output, the third inductor input and the third inductor output being located in one of the first metal layer and the second metal layer, the third inductor output being coupled to ground;
a fourth on-chip inductor comprising a fourth plurality of first layer segments in the first metal layer, a fourth plurality of second layer segments in the second metal layer, a fourth inductor input and a fourth inductor output, and a fourth plurality of through silicon vias coupling the fourth plurality of first layer segments and the fourth plurality of second layer segments to form a continuous, non-intersecting path between the fourth inductor input and the fourth inductor output, the fourth inductor input and the fourth inductor output being located in one of the first metal layer and the second metal layer, the fourth inductor output being coupled to ground;
the third on-chip inductor being inductively coupled to the fourth on-chip inductor, and the third on-chip inductor not being physically coupled to the fourth on-chip inductor except through ground; and
a first on-chip transistor comprising a gate, a drain and a source, the gate of the first on-chip transistor being coupled to the second inductor input, the drain of the first on-chip transistor being coupled to the third inductor input, and the source of the first on-chip transistor being coupled to ground.

18. The three dimensional on-chip electronic device of claim 16, wherein the first metal layer is located in a back-end-of-line section of the chip.

19. The three dimensional on-chip electronic device of claim 16, wherein the second metal layer is located in a redistributed design layer of the chip.

20. The three dimensional on-chip electronic device of claim 16, further comprising:
- a fifth inductor including a fifth inductor input and a fifth inductor output, the fifth inductor input being coupled to a supply voltage, the fifth inductor output being coupled to the drain of the first on-chip transistor;
- a sixth inductor including a sixth inductor input and a sixth inductor output, the sixth inductor input being coupled to the supply voltage; and
- a second on-chip transistor including a gate, a drain and a source; the gate of the second on-chip transistor being coupled to the drain of the first on-chip transistor; the drain of the second on-chip transistor being coupled to the third inductor input and to the sixth inductor output, the source of the second on-chip transistor being coupled to ground.

21. The three dimensional on-chip electronic device of claim 20, wherein the fifth on-chip inductor comprises a fifth plurality of first segments in the first metal layer, a fifth plurality of second segments in a second metal layer and a fifth plurality of through silicon vias coupling the fifth plurality of first segments and the fifth plurality of second segments to form a continuous, non-intersecting path between the fifth inductor input and the fifth inductor output, the fifth inductor input and the fifth inductor output being located in one of the first metal layer and the second metal layer; and the sixth on-chip inductor comprises a sixth plurality of first segments in the first metal layer, a sixth plurality of second segments in the second metal layer and a sixth plurality of through silicon vias coupling the sixth plurality of first segments and the sixth plurality of second segments to form a continuous, non-intersecting path between the sixth inductor input and the sixth inductor output, the sixth inductor input and the sixth inductor output being located in one of the first metal layer and the second metal layer.

22. The on-chip inductor of claim 6, wherein the first inductor input is located in one of the first metal layer and the second metal layer, and the second inductor input is located in a third metal layer.

23. The on-chip inductor of claim 22, wherein the on-chip inductor has a generally spiral shape having a central end and an exterior end, the first inductor input being coupled to the center end of the spiral shape, and the second inductor input being coupled to the exterior end of the spiral shape.

* * * * *